(12) United States Patent
Ishida et al.

(10) Patent No.: US 11,232,911 B2
(45) Date of Patent: Jan. 25, 2022

(54) CAPACITOR

(71) Applicant: Murata Manufacturing Co., Ltd., Nagaokakyo (JP)

(72) Inventors: Nobuhiro Ishida, Nagaokakyo (JP); Junko Izumitani, Nagaokakyo (JP); Masatomi Harada, Nagaokakyo (JP); Takeshi Kagawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 216 days.

(21) Appl. No.: 16/386,694

(22) Filed: Apr. 17, 2019

(65) Prior Publication Data

US 2019/0244762 A1 Aug. 8, 2019

Related U.S. Application Data

(63) Continuation of application No. PCT/JP2017/042725, filed on Nov. 29, 2017.

(30) Foreign Application Priority Data

Dec. 1, 2016 (JP) .............................. JP2016-234364

(51) Int. Cl.
| | | |
|---|---|---|
| *H01G 4/33* | (2006.01) | |
| *H01G 4/228* | (2006.01) | |
| *H01G 4/012* | (2006.01) | |
| *H01G 4/12* | (2006.01) | |
| *H01G 4/236* | (2006.01) | |

(52) U.S. Cl.
CPC .............. *H01G 4/33* (2013.01); *H01G 4/012* (2013.01); *H01G 4/12* (2013.01); *H01G 4/228* (2013.01); *H01G 4/236* (2013.01)

(58) Field of Classification Search
CPC ....................................................... H01G 4/33
See application file for complete search history.

(56) References Cited

U.S. PATENT DOCUMENTS

2015/0325368 A1   11/2015   Namikawa

FOREIGN PATENT DOCUMENTS

| JP | 2001284166 A | * | 10/2001 |
|---|---|---|---|
| JP | 2002075781 A | * | 3/2002 |
| JP | 2007188957 A | | 7/2007 |
| JP | 2007194595 A | | 8/2007 |
| JP | 2008117873 A | | 5/2008 |
| JP | 2015216246 A | | 12/2015 |

OTHER PUBLICATIONS

International Search Report issued for PCT/JP2017/042725, dated Feb. 20, 2018.
Written Opinion of the International Searching Authority issued for PCT/JP2017/042725, dated Feb. 20, 2018.

* cited by examiner

*Primary Examiner* — Eric W Thomas
(74) *Attorney, Agent, or Firm* — Arent Fox LLP (57) ABSTRACT

A capacitor that includes a substrate having a first principal surface, a second principal surface facing the first principal surface, and a first end surface connecting the first principal surface and the second principal surface, a lower electrode on the first principal surface of the substrate, a dielectric film on the lower electrode, an upper electrode on the dielectric film, a protective film covering the upper electrode and having a thickness smaller than that of the substrate, and a first terminal electrode on the first end surface and electrically connected to one of the upper electrode and the lower electrode.

20 Claims, 6 Drawing Sheets

CAPACITOR

CROSS REFERENCE TO RELATED APPLICATIONS

The present application is a continuation of International application No. PCT/JP2017/042725, filed Nov. 29, 2017, which claims priority to Japanese Patent Application No. 2016-234364, filed Dec. 1, 2016, the entire contents of each of which are incorporated herein by reference.

FIELD OF THE INVENTION

The present invention relates to a capacitor and a manufacturing method therefor.

BACKGROUND OF THE INVENTION

As a representative capacitor element used for a semiconductor integrated circuit, for example, a metal insulator metal (MIM) capacitor has been known well. The MIM capacitor is a capacitor including a parallel plate type structure in which a dielectric substance is sandwiched between a lower electrode and an upper electrode. For example, a capacitor described in Patent document 1 includes a base electrode, a dielectric layer formed on the base electrode, an upper electrode layer formed on the dielectric layer, and a terminal electrode connected to the upper electrode layer.

Patent Document 1: Japanese Patent Application Laid-Open No. 2015-216246

SUMMARY OF THE INVENTION

For example, in a capacitor that is used as a matching element for high frequency impedance and has a capacitance value of about 0.1 to several 10 pF, a target capacitance value is requested to be formed with a narrow deviation, such as ±0.05 pF. In order to form a capacitor with a targeted capacitance value accurately, in addition to form the capacitance (intrinsic capacitance) with high accuracy in a MIM portion in which a dielectric layer (I) is sandwiched between a lower electrode (M) and an upper electrode (M), it becomes necessary to make stray capacitance that occurs other than the intrinsic capacitance, as small as possible. For example, in a conventional capacitor in which a terminal electrode and an electrode layer face each other across a protective layer formed on the electrode layer, it is assumed that a facing area between the electrode layer and the terminal electrode is S, an interlayer distance is d, and a dielectric constant of the protective layer is $\varepsilon$, stray capacitance C that occurs between the electrode layer and the terminal electrode can be denoted by $C=\varepsilon \times S/d$. In the above-described conventional capacitor, the comparatively large stray capacitance C will occur. Moreover, in order to make the height of a capacitor low, it is necessary to make an interlayer distance d small. In the case where an interlayer distance d is short, a fluctuation of the stray capacitance C becomes large due to a fluctuation of the interlayer distance d.

Because of this, between a lower electrode and a terminal electrode, a comparatively large stray capacitance C having a comparatively large fluctuation will occur. Since the stray capacitance parasitizes in parallel to the MIM portion (intrinsic capacitance), if a comparatively large stray capacitance C has occurred, even if the MIM portion (intrinsic capacitance) has been formed with high accuracy, the capacitance value deviates from the targeted capacitance value. As a result, a problem that the narrow deviation cannot be realized has occurred.

The present invention has been achieved in view of such circumstances and aims at providing a capacitor capable of aiming at reduction of a fluctuation of a capacitance value.

A capacitor according to one mode of the present invention includes a substrate having a first principal surface, a second principal surface facing the first principal surface, and a first end surface connecting the first principal surface and the second principal surface; a lower electrode on the first principal surface of the substrate; a dielectric film on the lower electrode; an upper electrode on the dielectric film; a protective film covering the upper electrode and having a thickness smaller than a thickness of the substrate; and a first terminal electrode on the first end surface and electrically connected to one of the upper electrode and the lower electrode.

In the capacitor according one aspect of the present invention, the substrate further includes a second end surface facing the first end surface, the capacitor further including a second terminal electrode that is provided on the second end surface and is electrically connected to the other of the upper electrode and the lower electrode.

According to the above-described mode, it is possible to reduce a facing area between the first terminal electrode and the lower electrode and in which stray capacitance occurs. Furthermore, it is possible to make a distance between the first terminal electrode and the lower electrode longer. From this, it is possible to reduce stray capacitance that parasitizes intrinsic capacitance. Moreover, in the case of a configuration including the second terminal electrode, since the second terminal electrode faces the lower electrode of the same electric potential across the substrate, it is possible to suppress the occurrence of the stray capacitance constituted by the second terminal electrode.

A capacitor according to another mode of the present invention includes a substrate including a first principal surface, a second principal surface facing the first principal surface, a first end surface connecting the first principal surface and the second principal surface, and a first through hole penetrating from the second principal surface to the first principal surface; a lower electrode on the first principal surface of the substrate; a dielectric film on the lower electrode; an upper electrode on the dielectric film; a protective film covering the upper electrode and having a thickness smaller than a thickness the substrate; a first via electrode inside of the first through hole and electrically connected to one of the upper electrode and the lower electrode; and a first terminal electrode on the second principal surface and electrically connected to the first via electrode.

In the capacitor according to another aspect of the present invention, the substrate further includes a second end surface facing the first end surface and a second through hole penetrating, in the vicinity of the second end surface, from the second principal surface to the first principal surface, the capacitor further including a second via electrode inside of the second through hole and electrically connected to the other of the upper electrode and the lower electrode, and a second terminal electrode on the second principal surface and electrically connected to the second via electrode.

According to the above-described mode, it is possible to make a distance between the first terminal electrode and the lower electrode, and in which stray capacitance occurs, longer. Therefore, it is possible to reduce stray capacitance that parasitizes intrinsic capacitance. Moreover, in the case of a configuration including the second terminal electrode, since the second terminal electrode faces the lower electrode of the same electric potential across the substrate, it is possible to suppress the occurrence of the stray capacitance constituted by the second terminal electrode.

A manufacturing method for a capacitor according to one aspect of the present invention includes forming a lower conductive layer including a lower electrode on a first principal surface of a substrate; a step of providing a dielectric film on the lower conductive layer; forming an upper conductive layer including an upper electrode on the dielectric film; forming a protective film on the upper conductive layer; and forming a first terminal electrode on a first end surface of the substrate and electrically connected to one of the upper electrode and the lower electrode, the first end surface connecting the first principal surface and a second principal surface facing the first principal surface of the substrate.

According to the above-described mode, it is possible to manufacture a capacitor capable of reducing stray capacitance that parasitizes intrinsic capacitance.

According to the present invention, a capacitor capable of reducing a fluctuation of a capacitance value is provided.

DETAILED DESCRIPTION OF PREFERRED EMBODIMENT OF THE INVENTION

Hereinafter, the embodiments of the present invention will be described with reference to the drawings. However, in the second embodiment, the same or similar elements to those in the first embodiment are denoted by the same or similar symbols to those in the first embodiment, and detailed description will be omitted appropriately.

Moreover, with regard to the effects obtained in the second embodiment, description for those similar to those in the first embodiment will be omitted appropriately. The drawings of each of the embodiments are for exemplification, the dimensions and shapes of each portion are schematic, and the technical scope of the present invention should not be comprehended by limiting to the concerned embodiments.

In order to clarify the relationship among drawings and to help to understand the positional relationship among members, an orthogonal coordinate system (XYZ coordinate system) consisting of an X axis, a Y axis, and a Z axis may be attached to each of the drawings for the sake of convenience. In this case, for example, it is assumed that a direction parallel to the X axis is called "a first direction X". Similarly, it is assumed that a direction parallel to the Y axis is called "a second direction Y" and a direction parallel to the Z axis is called "a third direction Z". In this connection, it is assumed that the first direction should not be limited to the positive direction of an arrow mark in the X-axis direction and includes the negative direction opposite to the arrow mark.

Moreover, it is assumed that a surface parallel to a surface specified by the first direction X and the second direction Y is called "an XY surface", and, in the below, the same manner is applied to a surface parallel a surface specified by the other axis. In this connection, the first direction X, the second direction Y, and the third direction Z may be directions that intersect with each other at angles other than orthogonal.

First Embodiment

Figure 1:
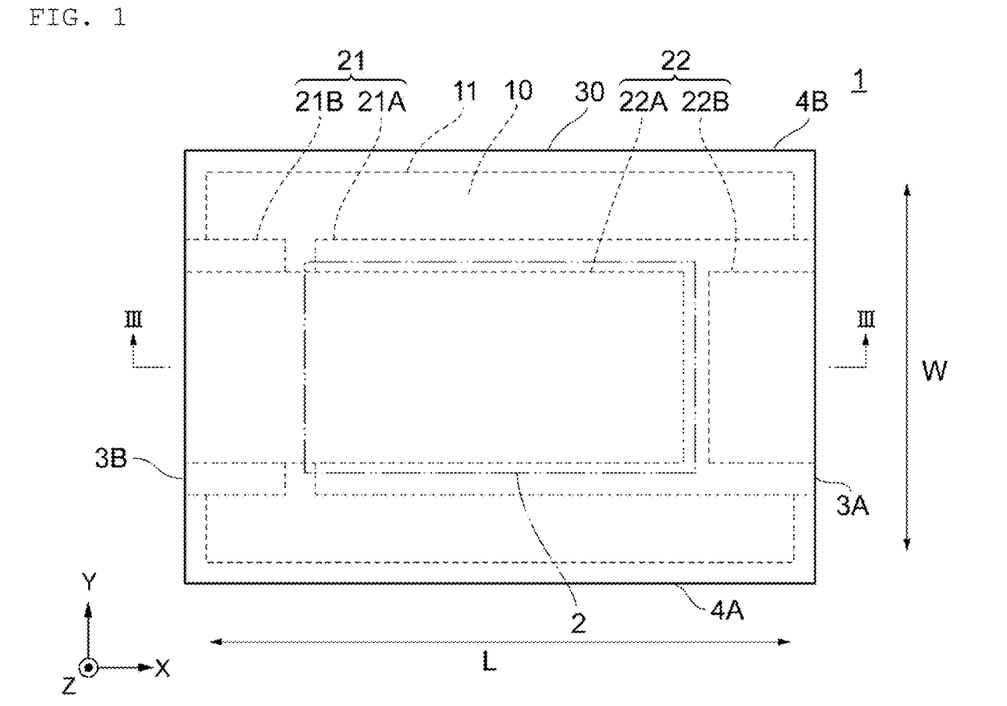
FIG. 1 is a plan view showing a capacitor according to the first embodiment of the present invention.
Figure 2:
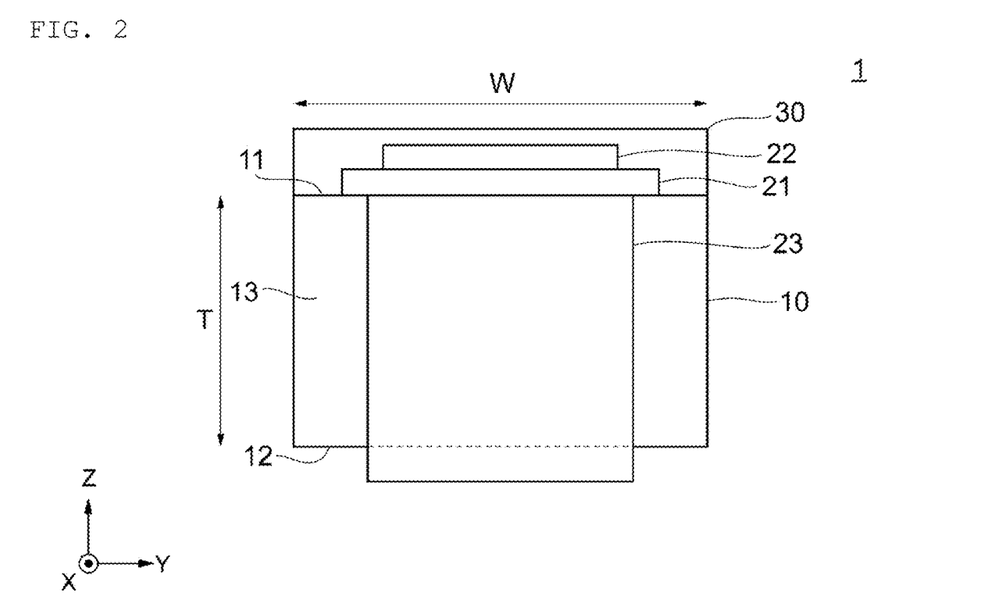
FIG. 2 is a side view of the capacitor shown in FIG. 1.
Figure 3:
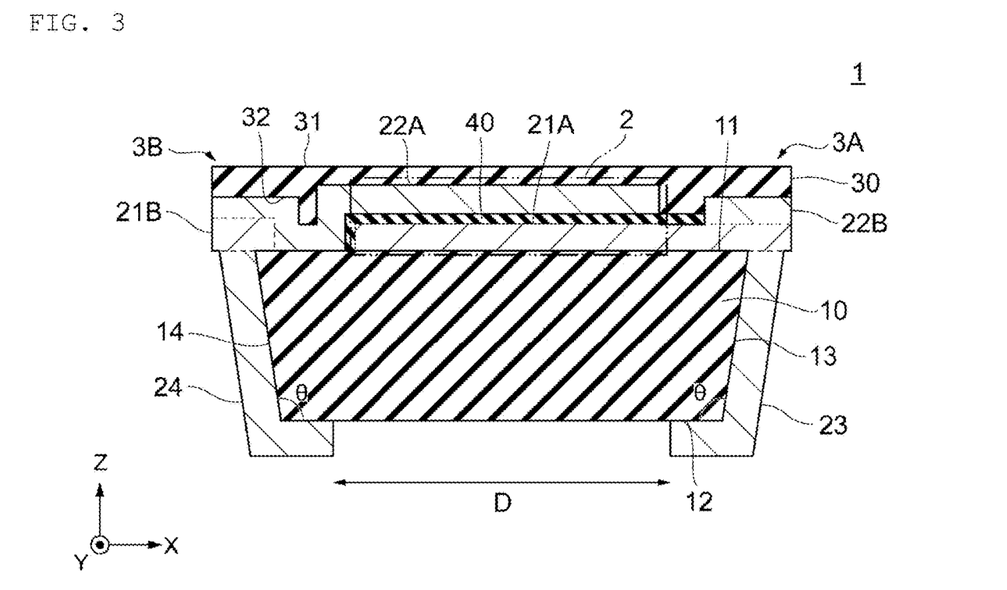
FIG. 3 is a cross sectional view taken along an line in the capacitor shown in FIG. 1.

A capacitor according to the first embodiment of the present invention is described with reference to FIG. 1 through FIG. 3. Here, FIG. 1 is a plan view showing the capacitor according to the first embodiment of the present invention. FIG. 2 is a side view of the capacitor shown in FIG. 1 as viewed from a positive direction side of the first direction X. FIG. 3 is a cross sectional view taken along an III-III line in the capacitor shown in FIG. 1.

The capacitor 1 includes a substrate 10, a lower conductive layer 21 (a lower electrode 21A, a lower portion 21B), a dielectric film 40, an upper conductive layer 22 (an upper electrode 22A, an upper portion 22B), and a protective film 30. Furthermore, the capacitor 1 includes a first terminal electrode 24 and a second terminal electrode 23.

Moreover, when viewed in a planar view (hereinafter, referred to as a "planar view") from the positive direction side of the third direction Z, the capacitor 1 includes an intrinsic capacitance portion 2 that forms a targeted capacitance value (intrinsic capacitance), at a central portion of the capacitor. The intrinsic capacitance portion 2 is capacitance formed by the upper electrode 22A, the lower electrode 21A, and the dielectric film 40, and in the intrinsic capacitance portion 2, the upper electrode 22A and the lower electrode 21A face each other in the normal direction of a later-mentioned first principal surface 11 of the substrate 10 so as to sandwich the dielectric film 40 therebetween.

When viewed in a planar view, the capacitor 1 is, for example, a square shape, and includes one pair of short sides 3A and 3B facing each other in the first direction X and one pair of long sides 4A and 4B facing each other in the second direction Y. In this connection, the short sides 3A and 3B each may be shaped in a straight line parallel to the second direction Y or may be at least partially bent.

The short sides 3A and 3B each is separated from the intrinsic capacitance portion 2.

The substrate 10 includes a first principal surface 11 and a second principal surface 12 facing the first principal surface 11 in the third direction Z. Moreover, the substrate 10 includes a first end surface 14 connecting the first principal surface 11 and the second principal surface 12 and a second end surface 13 facing the first end surface 14 in the first direction X. The second end surface 13 also connects the first principal surface 11 and the second principal surface 12. In the present example, the first principal surface 11 and the second principal surface 12 each are a flat surface parallel to an XY plane defined by the first direction X and the second direction Y, and have a square shape. The area of the second principal surface 12 is smaller than the area of the first principal surface 11. Moreover, when viewed in a planar view from the normal direction of the first principal surface 11, the second principal surface 12 is located inside the first principal surface 11. An angle θ formed by the first end surface 14 with the second principal surface 12 is an obtuse angle. An angle formed by the second end surface 13 with the second principal surface 12 is equal to the angle θ.

That is, a cross section including the first end surface 14 and the second end surface 13 of the substrate 10 and is parallel to a ZX plane, is a so-called reversely-tapered shape. From a viewpoint of preventing a short circuit between terminal electrodes in the second principal surface 12 with securing sufficiently the area of the intrinsic capacitance portion 2 in the first principal surface 11, the angle θ is preferably 90 degrees to 135 degrees and is more preferably 100 degrees to 120 degrees. In this connection, the shape of the substrate may not be limited to these, the first end surface and the second end surface each may be vertical to the second principal surface, and an angle formed by each of the first end surface and the second end surface with the second principal surface may be an acute angle, which may be a so-called forwardly-tapered shape. Moreover, the angle of each of the first end surface and the second end surface relative to the second principal surface may change correspondingly to a distance from the second principal surface. Even with such a configuration, it is preferable that at least a part of the first end surface 14 includes a tapered shape in which an angle formed with the second principal surface 12 is an obtuse angle, and with regard to also at least a part of the second end surface 13, it is preferable that an angle formed with the second principal surface 12 is an obtuse angle.

The substrate 10 is, for example, a semiconductor substrate such as a silicon substrate and a gallium arsenide substrate, or an insulating substrate such as a glass substrate and an alumina substrate. For example, when viewed the first principal surface 11 in a planar view, the length L of the substrate 10 along the first direction X is 200 μm to 600 μm, and the width W along the second direction Y is 100 μm to 300 μm. The thickness T of the substrate 10 along the third direction Z between the first principal surface 11 and the second principal surface 12 is 5 μm to 300 μm. Moreover, from a viewpoint of securing the mechanical strength of the capacitor 1, the thickness T of the substrate 10 is preferably larger than the thickness of the protective film 30 and is preferably larger than the sum of the thicknesses of the lower conductive layer 21, the protective film 30, the upper conductive layer 22, and the protective film 30. The substrate 10 may be a multilayer structure, and for example, includes a semiconductor substrate and an insulating layer. As one example of such a multilayer structure, a substrate including a silicon substrate and a silicon oxide formed on the first principal surface 11 side can be cited. It may be sufficient that the insulating layer such as a silicon oxide can electrically insulate between a semiconductor substrate and a lower conductive layer, and the thickness is preferably 0.5 μm or more and 3 μm or less.

The lower conductive layer 21 includes the lower electrode 21A and the lower portion 21B. The lower electrode 21A and the lower portion 21B are separated electrically from each other, and are adjacent to each other in the first direction X. Specifically, the lower electrode 21A extends in the first direction X from the short side 3A and is disposed in the intrinsic capacitance portion 2. The lower portion 21B extends in the first direction X from the short side 3B. The lower electrode 21A and the lower portion 21B are formed on the first principal surface 11 of the substrate 10. In order to lower the series resistance, the thickness of the lower conductive layer 21 is preferably relatively large. Specifically, the thickness of the lower electrode 21A is preferably 0.3 μm to 10 μm, and more preferably 0.5 μm to 5 μm. In this connection, the lower portion 21B may be omitted.

The dielectric film 40 is formed on the lower electrode 21A. Specifically, the dielectric film 40 is formed so as to cover a portion corresponding to the intrinsic capacitance portion 2 of the lower electrode 21A. The dielectric film 40 is formed of materials having dielectric or insulating properties, such as, oxides, such as $SiO_2$, $Al_2O_3$, $HfO_2$, $Ta_2O_5$, and $ZrO_2$, and nitrides, such as SiN. The thickness of the dielectric film 40 is preferably 0.02 μm to 2 μm.

The upper conductive layer 22 includes the upper electrode 22A and the upper portion 22B. The upper electrode 22A and the upper portion 22B are separated electrically from each other and are adjacent to each other in the first direction X. The upper electrode 22A extends in the first direction X from the short side 3B and is disposed in the intrinsic capacitance portion 2. The upper electrode 22A is formed on the dielectric film 40, the lower portion 21B, and the substrate 10. That is, the upper electrode 22A faces the lower electrode 21A in the third direction Z so as to sandwich the dielectric film 40 therebetween. The upper portion 22B extends in the first direction X from the short side 3A. The upper portion 22B is formed on the lower electrode 21A. In order to lower the series resistance, the thickness of the upper conductive layer 22 is preferably relatively large. Specifically, the thickness of the upper conductive layer 22 is preferably 0.3 μm to 10 μm, and, more preferably 0.5 μm to 5 μm. On the first end surface 14 side, the lower portion 21B and the upper electrode 22A overlap with each other. On the second end surface 13 side, the lower electrode 21A and the upper portion 22B overlap with each other.

Each of the lower electrode 21A and the upper electrode 22A is preferably formed of a metal composed of Cu, Ag, Au, Al, Ni, Cr, Ti, or the like, or a conductor containing these metals. The lower electrode 21A and the upper electrode 22A may include a plurality of layers formed of materials different from each other. The lower electrode 21A and the upper electrode 22A may be made with a similar material to each other. The lower electrode 21A and the upper electrode 22A may be provided by different materials from each other. The lower portion 21B is formed simultaneously with the lower electrode 21A and has a similar material to that of the lower electrode 21A. Moreover, the upper portion 22B also has the similar material to that of the upper electrode 22A. However, the lower portion 21B may have a material different from that of the lower electrode 21A, and the upper portion 22B may have a material different from that of the upper electrode 22A.

The protective film 30 is formed on the upper conductive layer 22. Specifically, the protective film 30 is formed so as to cover the lower conductive layer 21, the dielectric film 40, and the upper conductive layer 22. Moreover, the protective film 30 may be formed also so as to cover the first principal surface 11 of the substrate 10. In the present example, when viewed in a planar view, the protective film 30 is formed over the whole surface of the capacitor 1. Namely, the short sides 3A and 3B of the capacitor 1 correspond to the short sides of the protective film 30, and the long sides 4A and 4B of the capacitor 1 correspond to the long sides of the protective film 30.

The protective film 30 has a third principal surface 31 located on a side away from the substrate 10 and a fourth principal surface 32 located on a side opposite to the third principal surface 31. Since the fourth principal surface 32 extends along a surface formed by the lower conductive layer 21, the upper conductive layer 22, and the like, it has a flatness lower than the first principal surface 11 and the second principal surface 12 of the substrate 10. Since the third principal surface 31 reflects the shape of the fourth principal surface 32, its flatness is lower than the first principal surface 11 and the second principal surface 12 of the substrate 10, and its flatness is higher than the fourth principal surface 32. The protective film 30 is formed of an insulating material, such as a polyimide resin and a silicon oxide. The protective film 30 is preferably formed to be larger in film thickness as compared with the lower conductive layer 21, the dielectric film 40, and the upper conductive layer 22, and is formed of, for example, organic materials. The thickness of the protective film 30 is preferably 1 μm to 20 μm.

The first terminal electrode 24 is formed from the first end surface 14 over to the second principal surface 12 of the substrate 10. The first terminal electrode 24 is to be electrically connected to the upper electrode 22A and may be formed at least on the first end surface 14. In the example shown in the drawing, the first terminal electrode 24 is electrically connected to the upper electrode 22A through the lower portion 21B of the lower conductive layer 21. That is, the first terminal electrode 24 is connected to the lower portion 21B in a region where the lower portion 21B and the upper electrode 22A overlap with each other. According to this, the electric connectivity between the first terminal electrode 24 and the upper electrode 22A can be improved. From the viewpoint of reducing stray capacitance, when viewed in a planar view from the normal direction of the first principal surface 11, it is preferable that the first terminal electrode 24 is located on the outside of the intrinsic capacitance portion 2. In other words, it is preferable that the first terminal electrode 24 is located on the outside of the lower electrode 21A with a planar view.

The second terminal electrode 23 is formed from the second end surface 13 of the substrate 10 over to the second principal surface 12. The second terminal electrode 23 is to be electrically connected to the lower electrode 21A and may be formed at least on the second end surface 13. In the example shown in the drawings, the second terminal electrode 23 is connected directly to the lower electrode 21A. The second terminal electrode 23 is connected to the lower electrode 21A in a region where the lower electrode 21A and the upper portion 22B overlap with each other. According to this, the electric connectivity between the second terminal electrode 23 and the lower electrode 21A can be improved. On the second principal surface 12, the second terminal electrode 23 and the first terminal electrode 24 are separated from each other in the first direction X by being spaced with an inter-terminal distance D (distance between terminals).

Figure 4:
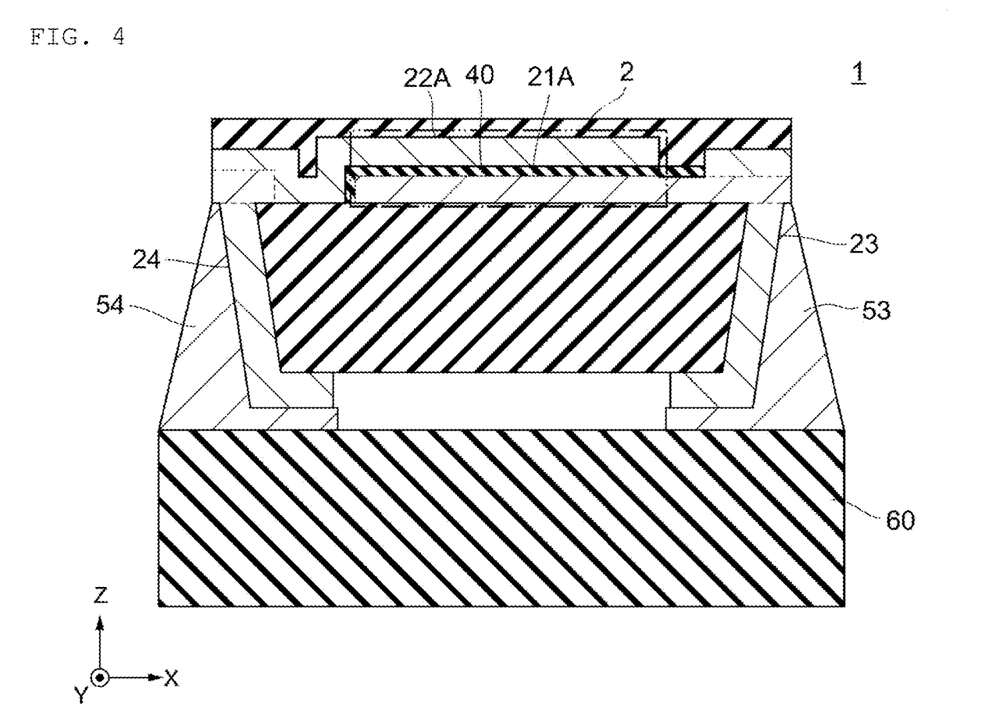
FIG. 4 is a cross sectional view showing a capacitor mounted on a circuit board.

Next, with regard to the mounting of the capacitor 1 onto a circuit board 60, description is given while referring to FIG. 4. Here, FIG. 4 is a cross sectional view showing a capacitor mounted on a circuit board. The capacitor 1 is fixed to the circuit board 60 with solders 53 and 54. The solder 54 is formed between the circuit board 60 and the first terminal electrode 24. That is, the upper electrode 22A is electrically connected to the outside through the first terminal electrode 24 and the solder 54. The solder 54 is arranged along the first end surface 14 side and the second principal surface 12 side of the first terminal electrode 24, and when viewed in a planar view, the solder 54 spreads on the outside of the capacitor 1. The solder 53 is formed between the circuit board 60 and the second terminal electrode 23. That is, the lower electrode 21A is electrically connected to the outside through the second terminal electrode 23 and the solder 53. The solder 53 is arranged along the second end surface 13 side and the second principal surface 12 side of the second terminal electrode 23, and when viewed in a planar view, the solder 53 spreads on the outside of the capacitor 1. That is, the solders 53 and 54 each become a fillet shape. In this connection, from the viewpoint of reducing stray capacitance, when viewed in a planar view, it is preferable that the solder 54 is located on the outside of the lower electrode 21A.

Next, with reference to FIG. 5A through FIG. 5H, one example of a manufacturing method for a capacitor is described.

Figure 5A:
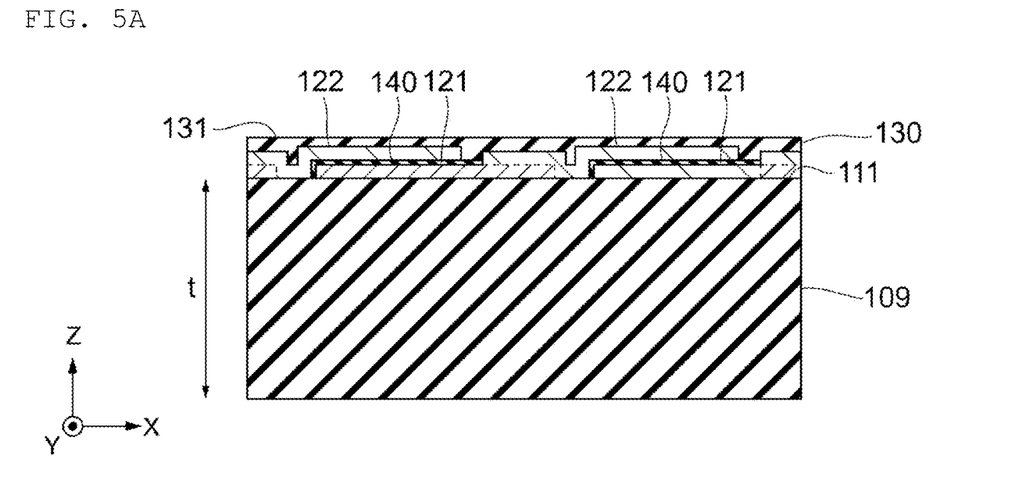
FIG. 5A is an illustration showing a step of providing a lower electrode, a dielectric film, an upper electrode, and a protective film on a mother substrate.

FIG. 5A is an illustration showing a step of providing a lower electrode, a dielectric film, an upper electrode, and a protective film on a mother substrate. First, a mother substrate 109 is prepared. At this time, the thickness t of the mother substrate 109 is larger than the thickness T of a substrate of a capacitor. Next, a lower conductive layer 121 including a lower electrode is formed on the mother substrate 109. The lower conductive layer 121 is pattern-formed by, for example, a semi-additive method. The lower conductive layer 121 may be pattern-formed by performing an etching process for a conductive layer formed by a physical vapor deposition (PVD) method or a chemical vapor deposition (CVD) method. Next, a dielectric film 140 is formed. The dielectric film 140 is pattern-formed by, for example, performing an etching process for a dielectric layer formed by a PVD method or a CVD method. Next, an upper conductive layer 122 including an upper electrode is formed. The upper conductive layer 122 is pattern-formed by, for example, the similar method to that in the lower conductive layer 121. Next, a protective film 130 is formed. The protective film 130 is formed by, for example, a wet process, such as a spin coating method. With this, a third principal surface 131 of the protective film 130 has a high flatness as compared with a fourth principal surface 132, and its processability in the subsequent processes can be improved.

Figure 5B:
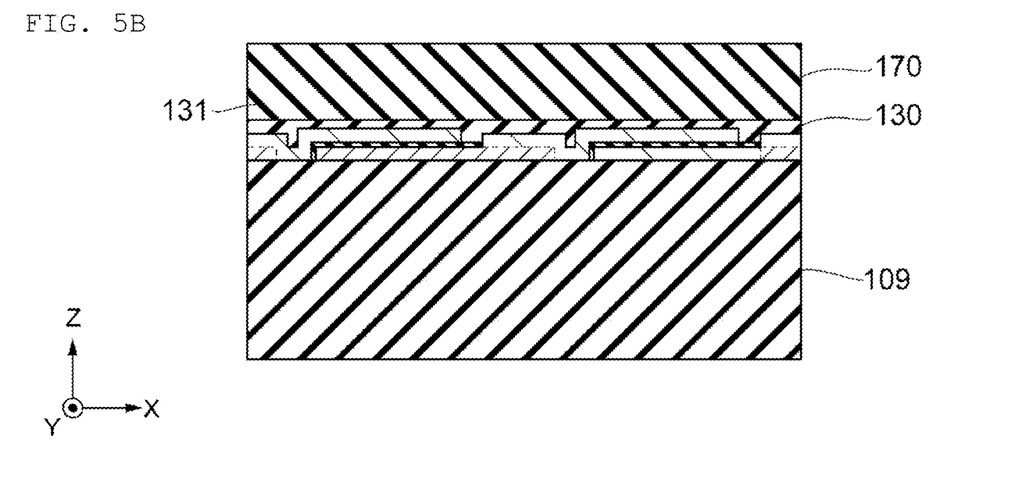
FIG. 5B is an illustration showing a step of providing a support substrate.

FIG. 5B is an illustration showing a step of providing a support substrate. After the protective film 130 is formed, a support substrate 170 is stuck onto the protective film 130. The support substrate 170 is used for temporarily fixing the mother substrate 109. In order to suppress distortion of the mother substrate 109 in the subsequent step, it is preferable that the support substrate 170 is formed by, for example, inorganic materials, such as a glass substrate and a silicon substrate.

Figure 5C:
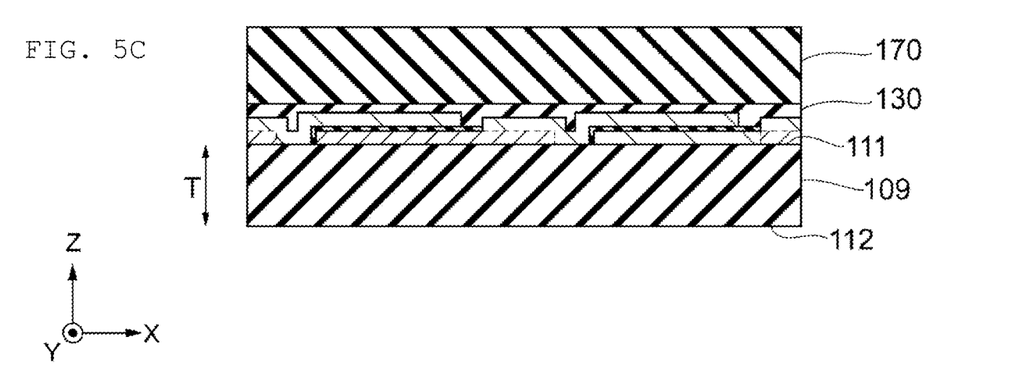
FIG. 5C is an illustration showing a step of grinding a substrate.

FIG. 5C is an illustration showing a step of grinding the substrate. Here, the mother substrate 109 is ground to form a second principal surface 112. At this time, the mother substrate 109 is ground so as to have the thickness T. The mother substrate 109 is ground by, for example, physical polishing or chemical polishing.

Figure 5D:
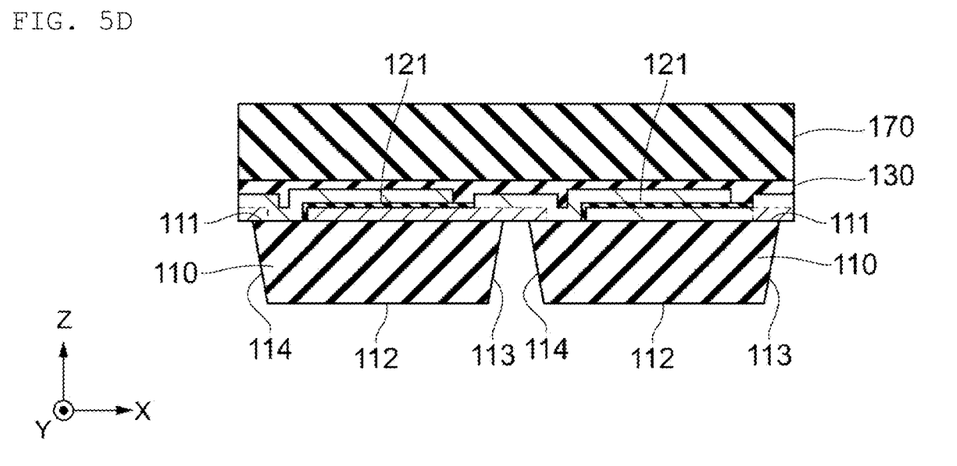
FIG. 5D is an illustration showing a step of excavating the substrate.

FIG. 5D is an illustration showing a step of excavating the substrate. Here, the mother substrate 109 is excavated from the second principal surface 112, and a first end surface 114 and a second end surface 113 are formed. The mother substrate 109 is excavated, for example by laser processing or sand blast processing. With this, the substrate 110 that has a first principal surface 111, the second principal surface 112, the first end surface 114, and the second end surface 113, is formed. In the case of performing excavating with laser processing, it is possible to control a taper angle of the substrate 110 with a comparatively wide range by, for example, changing the shape of a beam or performing defocusing. In the case of performing excavating with sand blast processing, it is possible to control a taper angle of the substrate 110 with a comparatively wide range by, for example, changing a processing pressure and a processing method. Moreover, the excavating may be performed with a combination of the laser processing and the sand blast processing. At this time, the grinding is performed so as to penetrate the mother substrate 109, thereby exposing the lower conductive layer 121. In this connection, the excavating position of the mother substrate 109 is a portion where the lower conductive layer 121 and the upper conductive layer 122 overlap with each other. For this reason, it is possible to suppress the protective film 130 from being exposed to the second main surface 112 side of the substrate 110 due to a matter that the lower conductive layer 121 and the upper conductive layer 122 are excavated by excessive excavation. According to this, it is possible to improve the electric connectivity between a first terminal electrode 124 provided in the subsequent step and the upper conductive layer 122, and to improve the electric connectivity between a second terminal electrode 123 provided in the subsequent step and the lower conductive layer 121.

Figure 5E:
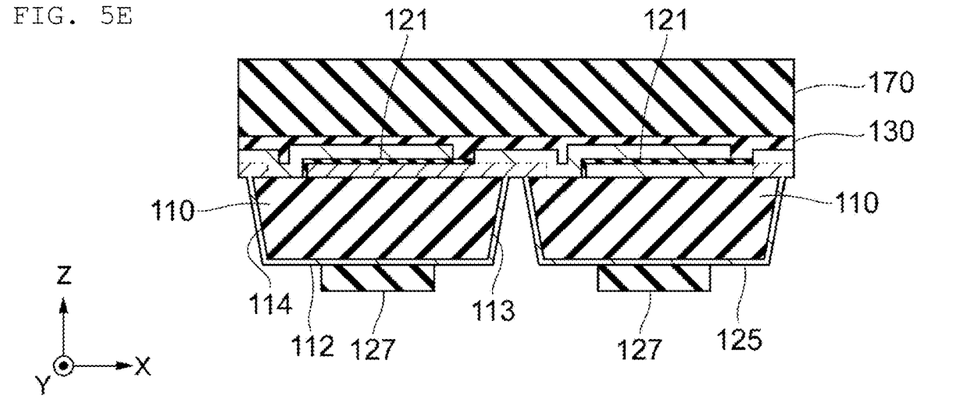
FIG. 5E is an illustration showing a step of providing a seed layer and a resist.

FIG. 5E is an illustration showing a step of providing a seed layer and a resist. First, a seed layer 125 is formed on the second principal surface 112, the first end surface 114, and the second end surface 113 of the substrate 110. The seed layer 125 is formed by a PVD method, such as vapor deposition and sputtering. The seed layer 125 becomes a part of the later-mentioned first terminal electrode 124 and second terminal electrode 123, and is preferably a metal composed of, for example, Cu, Ag, Au, Al, Ni, Cr, Ti, or the like, or a conductor containing these metals. The seed layer 125 may be formed so as to include a plurality of layers formed of different materials. Next, a resist 127 is pattern-formed. The resist 127 is photoresist and is pattern-formed by exposure and development after a resist layer is formed on the seed layer 125. The resist 127 faces the second principal surface 112 across the seed layer 125. Moreover, the resist 127 separates from the first end surface 114 and the second end surface 113 in the first direction X.

Figure 5F:
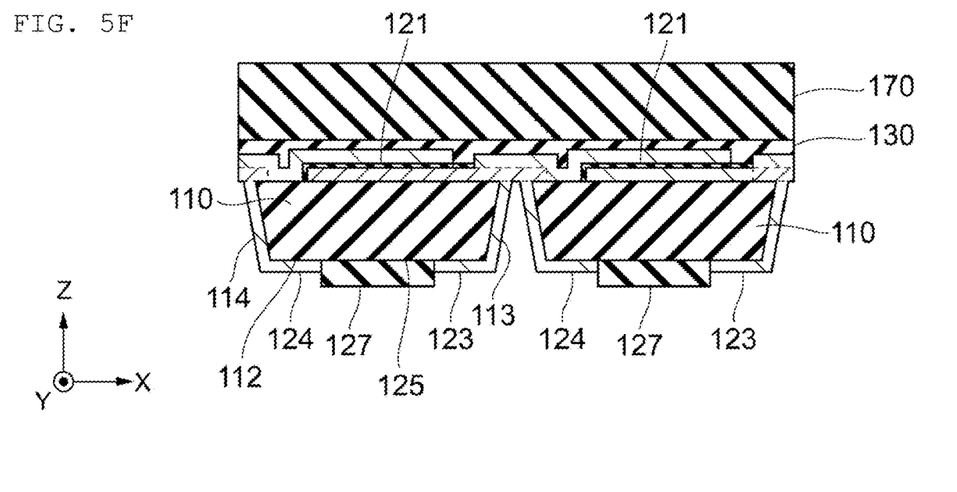
FIG. 5F is an illustration showing a step of providing a first terminal electrode and a second terminal electrode.

FIG. 5F is an illustration showing a step of providing a first terminal electrode and a second terminal electrode. By performing a plating process onto the seed layer 125, the first terminal electrode 124 and the second terminal electrode 123 are formed. In the plating process, a proper process is selected appropriately from electrolytic plating, electroless plating, and so on.

Figure 5G:
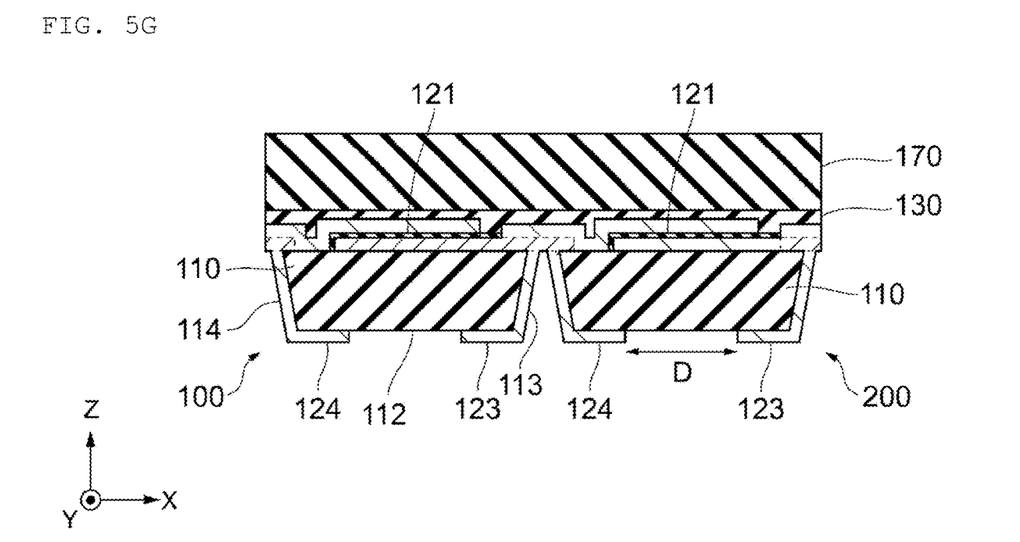
FIG. 5G is an illustration showing a step of removing the resist and the seed layer.

FIG. 5G is an illustration showing a step of removing the resist and the seed layer. First, the resist 127 is removed by an immersion process into stripping solution or an asking process. Next, the seed layer 125 covered with the resist 127 is removed by wet etching, dry etching, or the like. With this, on the second principal surface 112, the first terminal electrode 124 and the second terminal electrode 123 are separated in the first direction X with an inter-terminal distance D. That is, the inter-terminal distance D corresponds to the width, along the first direction X, of the resist 127.

Figure 5H:
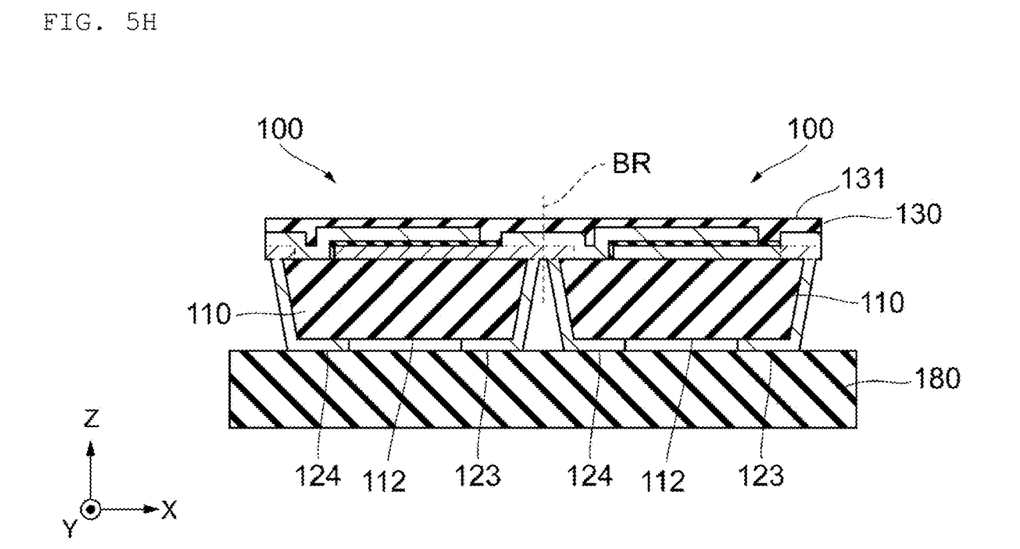
FIG. 5H is an illustration showing a step of peeling the support substrate from the protective film.

FIG. 5H is an illustration showing a step of peeling the support substrate from the protective film. After the seed layer 125 is removed, a transfer substrate 180 is attached onto the first terminal electrode 124 and the second terminal electrode 123, and the support substrate 170 is peeled from the protective film 130. The transfer substrate 180 is, for example, a dicing tape capable of causing adhesion to be changed by being irradiated with ultraviolet rays (UV). When the transfer substrate 180 is high adhesion, the support substrate 170 is peeled from the protective film 130, and a portion between the capacitors 100 is cut out at a break line BR indicated with a broken line in the illustration. The cutting between the capacitors 100 can be executed by blade dicing, stealth dicing, dry etching, or the like. Next, the transfer substrate 180 is irradiated with UV light so as to make the adhesion of the transfer substrate 180 lower, and then, the capacitors 100 are peeled from the transfer substrate 180 so as to be made individual pieces.

Next, the value of stray capacitance of the capacitor 1 according to the first embodiment is described. A table 1 indicated in the below is a table showing experimental results of stray capacitances measured in capacitors according to the first embodiment of the present invention. The stray capacitance C in the table is a capacitance formed by the lower electrode 21A and the first terminal electrode 24 that face each other across the substrate 10. With regard to the case of Examples 1 to 6 in which substrate dimensions L, W, and T were varied, the respective stray capacitances were calculated from the experimental results. In this connection, the inter-terminal distance D is uniformly determined as the shortest distance in which a short circuit between terminals does not occur, on the basis of the length L of the substrate. In the case where an angle θ is smaller than 90 degrees, since the area of the first principal surface in which an intrinsic capacitance portion is formed, becomes small, the lower limit of the angle θ was made 90 degrees. Moreover, from the maximum value of an angle range capable of securing the inter-terminal distance D, the upper limit of the angle θ was determined. Examples 1, 2, and 3 show the calculation results in the capacitors in which the length L of the substrate was made 0.4 mm, the width W was made 0.2 mm, and the thicknesses T were made 0.2 mm, 0.15 mm, and 0.05 mm, respectively. In Examples 1, 2, and 3, the inter-terminal distance D is 0.15 mm, and the upper limits of the angle θ are 122 degrees, 130 degrees, and 158 degrees, respectively. Examples 4, 5, and 6 show the calculation results in the capacitors in which the length L of the substrate was made 0.25 mm, the width W was made 0.125 mm, and the thicknesses T were made 0.125 mm, 0.1 mm, and 0.05 mm, respectively. In Examples 4, 5, and 6, the inter-terminal distance D is 0.1 mm, and the upper limits of the angle θ are 121 degrees, 127 degrees, and 146 degrees, respectively.

TABLE 1

| | Substrate Dimension | | | Inter-terminal Distance | Lower Limit of Angle | Upper Limit of Angle | Stray Capacitance |
|---|---|---|---|---|---|---|---|
| | L (mm) | W (mm) | T (mm) | D (mm) | θ (°) | θ (°) | C (pF) |
| Example 1 | 0.4 | 0.2 | 0.2 | 0.15 | 90 | 122 | 0.001 |
| Example 2 | | | 0.15 | | | 130 | 0.001 |
| Example 3 | | | 0.05 | | | 158 | 0.004 |
| Example 4 | 0.25 | 0.125 | 0.125 | 0.1 | | 121 | 0.001 |
| Example 5 | | | 0.1 | | | 127 | 0.001 |
| Example 6 | | | 0.05 | | | 146 | 0.002 |

In Example 1, the stray capacitance C is 0.001 pF. In Example 2, the stray capacitance C is 0.001 pF. In Example 3, the stray capacitance C is 0.004 pF. In Example 4, the stray capacitance C is 0.001 pF. In Example 5, the stray capacitance C is 0.001 pF. In Example 6, the stray capacitance C is 0.002 pF. In the case of the capacitor with a terminal electrode on the protective film 130, the stray capacitance becomes about 0.1 pF. That is, in any of Examples 1 to 6, also, the stray capacitance C is sufficiently reduced. Moreover, in Examples 1, 2, 4, 5, and 6 in which the angle θ becomes 146 degrees or less, the stray capacitance C becomes 0.002 pF or less, and in Examples 1, 2, 4, and 5 in which the angle θ becomes 130 degrees or less, the stray capacitance C becomes 0.001 pF or less.

Second Embodiment

Next, a capacitor 1 according to the second embodiment of the present invention will be described. In the second embodiment described in the below, the description about the matters common to those in the above-described first embodiment is omitted, and only the different points are described. In particular, similar effects by the similar components are not described again. Moreover, the components in the second embodiment provided with the same reference symbol as in the first embodiment are similar and function similar to those in the first embodiment.

Figure 6:
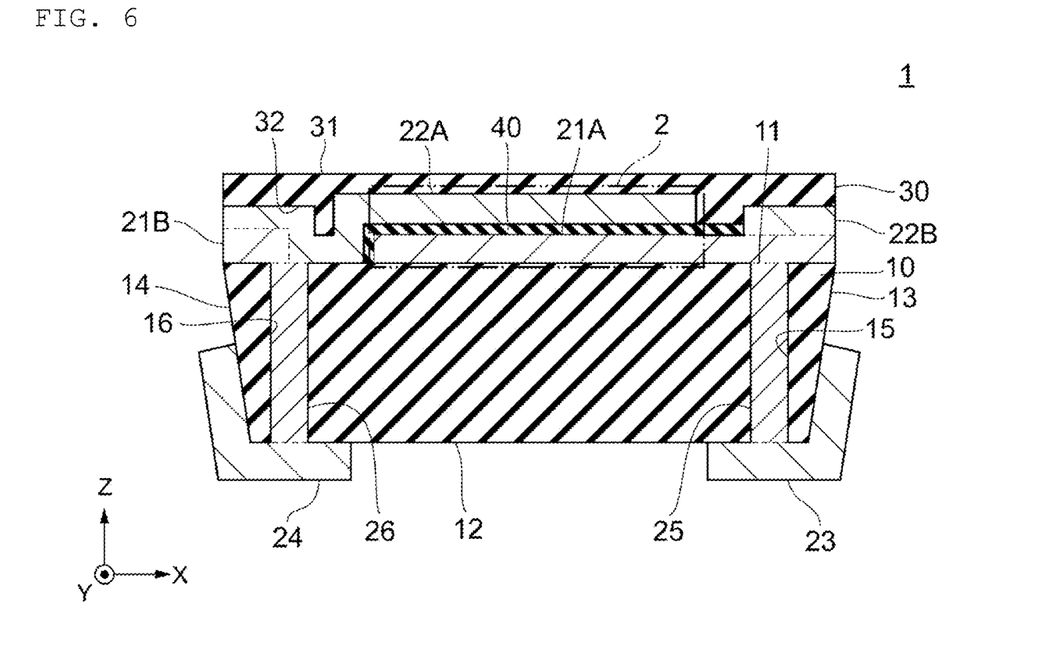
FIG. 6 is a cross sectional view showing a capacitor according to the second embodiment of the present invention.

FIG. 6 is a cross sectional view showing a capacitor according to the second embodiment of the present invention. The second embodiment is different from the first embodiment in a point that a first terminal electrode 24 and a second terminal electrode 23 are separated from a lower conductive layer 21. Moreover, a substrate 10 has a first through hole 16 that penetrates from a second principal surface 12 to a first principal surface 11 in the vicinity of a first end surface 14 and has a second through hole 15 that penetrates from the second principal surface 12 to the first principal surface 11 in the vicinity of a second end surface 13. In the inside of the first through hole 16, a first via electrode 26 electrically connected to an upper electrode 22A is formed. In the inside of the second through hole 15, a second via electrode 25 electrically connected to a lower electrode 21A is formed. The first terminal electrode 24 is electrically connected to the upper electrode 22A through the first via electrode 26. The second terminal electrode 23 is electrically connected to the lower electrode 21A through the second via electrode 25. In the example shown in FIG. 6, although the first terminal electrode 24 is formed from the second principal surface 12 over to the first end surface 14, the first terminal electrode 24 may be formed at least on the second principal surface 12. Similarly, although the second terminal electrode 23 is also formed from the second principal surface 12 over to the second end surface 13, the second terminal electrode 23 may be formed at least on the second principal surface 12.

As described in the above, according to the first embodiment, provided is the capacitor that includes the substrate 10 including the first principal surface 11, the second principal surface 12 facing the first principal surface 11, and the first end surface 14 connecting the first principal surface 11 and the second principal surface 12, the lower electrode 21A provided on the first principal surface 11 of the substrate 10, the dielectric film 40 provided on the lower electrode 21A, the upper electrode 22A provided on the dielectric film 40, the protective film 30 that is provided on the upper electrode 22A and has a thickness smaller than the substrate 10, and the first terminal electrode 24 that is provided on the first end surface 14 and is electrically connected to any one of the upper electrode 22A and the lower electrode 21A.

According to the first embodiment, it is possible to reduce a facing area between the first terminal electrode and the lower electrode where stray capacitance occurs.

Furthermore, it is possible to make a distance between the first terminal electrode and the lower electrode longer.

From these matters, it is possible to reduce the stray capacitance that parasitizes the intrinsic capacitance. Moreover, the area of the first terminal electrode can be increased and solder can be formed in a fillet shape at the time of mounting. Accordingly, it is possible to increase the fixing force of the solder of the first terminal electrode at the time of mounting the capacitor.

The first terminal electrode 24 may be provided from the first end surface 14 over to the second principal surface 12 of the substrate 10. According to this, the area of the first terminal electrode can be increased more, and the fixing force of the solder of the first terminal electrode can be improved.

The capacitor 1 is provided on the first principal surface 11 of the substrate 10, and further includes the lower portion 21B that is electrically separated from the lower electrode 21A and overlaps with an end portion of the upper electrode 22A, and the first terminal electrode 24 may be connected to the lower portion 21B. According to this, the electric connectivity between the first terminal electrode and the upper electrode can be improved.

The substrate 10 further includes the second end surface 13 facing the first end surface 14, and further, there may be provided the second terminal electrode 23 that is provided on the second end surface 13 and is electrically connected to the other of the upper electrode 22A and the lower electrode 21A. According to this, since the second terminal electrode faces the lower electrode of the same electric potential across the substrate, it is possible to suppress the occurrence of the stray capacitance constituted by the second terminal electrode. Moreover, the fixing force of the solder on the second terminal electrode can be improved. Since the first terminal electrode and the second terminal electrode can be made a symmetrical structure, the mounting attitude of the capacitor is stabilized. Moreover, a point that the solder becomes a fillet shape also contributes to the stability of the mounting attitude. Specifically, in the case of citing an example of a capacitor in which the length L of the substrate is 0.4 mm and the width W is 0.2 mm, with a configuration in which a terminal electrode is arranged on a protective film, for example, the fixing force of solder is about 1 N, and the inclination of the capacitor is 10 degrees. On the other hand, with a configuration according to the present embodiment, for example, the fixing force of solder has been improved to 2 N or more, and the inclination of the capacitor has been improved to 3 degrees or less.

The second terminal electrode 23 may be provided from the second end surface 13 over to the second principal surface 12 of the substrate 10. According to this, the area of the second terminal electrode can be increased more, and the fixing force of the solder of the second terminal electrode can be improved.

The capacitor 1 is provided on the lower electrode 21A, there is further provided the upper portion 22B that is electrically separated from the upper electrode 22A and overlaps with an end portion of the lower electrode 21A, and the second terminal electrode 23 is connected to a region where the lower electrode 21A overlaps with the upper portion 22B. According to this, the electric connectivity between the second terminal electrode and the lower electrode can be improved.

Furthermore, according to the second embodiment, provided is the capacitor that includes the substrate 10 including the first principal surface 11, the second principal surface 12 facing the first principal surface 11, the first end surface 14 connecting the first principal surface 11 and the second principal surface 12, and the first through hole 16 that penetrates from the second principal surface 12 to the first principal surface 11, the lower electrode 21A provided on the first principal surface 11 of the substrate 10, the dielectric film 40 provided on the lower electrode 21A, the upper electrode 22A provided on the dielectric film 40, the protective film 30 that is provided on the upper electrode 22A and has a thickness smaller than the substrate 10, the first via electrode 26 that is provided in the inside of the first through hole 16 and is electrically connected to any one of the upper electrode 22A and the lower electrode 21A, and the first terminal electrode 24 that is provided on the second principal surface 12 and is electrically connected to the first via electrode 26.

According to the above-described second embodiment, a distance between the first terminal electrode and the lower electrode where stray capacitance occurs, can be made longer. Therefore, even if a facing area between the first terminal electrode and the lower electrode is not reduced, it is possible to reduce the stray capacitance that parasitizes the intrinsic capacitance.

The first terminal electrode 24 may be provided from the second principal surface 12 over to the first end surface 14 of the substrate 10. According to this, the area of the first terminal electrode can be increased. Moreover, the solder that fixes the first end electrode at the time of mounting can be made a fillet shape. Therefore, the fixing force of the solder of the first terminal electrode can be improved.

The substrate 10 further includes a second end surface 13 facing the first end surface 14 and a second through hole 15 penetrating from the second principal surface 12 to the first principal surface 11, and further there may be provided the second via electrode 25 that is provided in the inside of the second through hole 15 and is electrically connected to the other of the upper electrode 22A and the lower electrode 21A, and a second terminal electrode 23 that is provided on the second principal surface 12 and is electrically connected to the second via electrode 25. According to this, since the second terminal electrode faces the lower electrode of the same electric potential across the substrate, it is possible to suppress the occurrence of stray capacitance constituted by the second terminal electrode. Moreover, since the first terminal electrode and the second terminal electrode can be made a symmetrical structure, the mounting attitude of the capacitor is stabilized.

The second terminal electrode 23 may be provided from the second principal surface 12 over to the second end surface 13 of the substrate 10. According to this, the area of the second terminal electrode can be increased more. Moreover, also the solder that fixes the second terminal electrode at the time of mounting may be formed in a fillet shape. Therefore, the fixing force of the solder of the second terminal electrode can be improved. In particular, with a configuration in which the first terminal electrode is provided over the first end surface and the second terminal electrode is provided over the second end surface, the mounting orientation of the capacitor is stabilized.

In also the capacitors according to any of the embodiments, further, when viewed in a planar view from the normal direction of the first principal surface 11, the first terminal electrode 24 may be located on the outside of the intrinsic capacitance portion 2 constituted by the upper electrode 22A, the dielectric film 40, and the lower electrode 21A. According to this, the facing area between the lower electrode and the first terminal electrode can be reduced more, and the stray capacitance can be reduced.

In also the capacitors according to any of the embodiments, the first principal surface 11 and the second principal surface 12 may be a flat surface. According to this, the handling properties of the substrate in the manufacturing process of the capacitor can be improved. Moreover, it is possible to suppress disconnection of the terminal electrode caused by an uneven surface.

In also the capacitors according to any of the embodiments, the thickness T of the substrate 10 may be larger than the sum of the thicknesses of the lower electrode 21A, the dielectric film 40, the upper electrode 22A, and the protective film 30. According to this, the stray capacitance can be reduced sufficiently. Moreover, the mechanical strength of the substrate can be secured, the poor formation due to damage such as cracks and deformation of the substrate can be reduced in the manufacturing process, and it is possible to improve the yield.

In also the capacitors according to any of the embodiments, at least a part of the first end surface 14 may have a tapered shape in which an angle formed with the second principal surface 12 is an obtuse angle. According to this, the area of the circuit board necessary for mounting of the capacitor can be reduced, while securing the area of the intrinsic capacitance portion. Moreover, the area of the first terminal electrode of the first end surface can be increased more, and further, the fixing force of the solder can be improved.

An angle that at least a part of the first end surface 14 forms with the second principal surface 12 may be 90 degrees to 135 degrees. According to this, the area of the first terminal electrode on the first end surface can be increased more, and the fixing force of the solder can be improved.

Moreover, according to other mode of the present invention, provided is the manufacturing method for a capacitor, includes a step of providing the lower conductive layer 121 including the lower electrode on the first principal surface 111 of the substrate 110, step of providing the dielectric film 140 on the lower conductive layer 121, a step of providing the upper conductive layer 122 including the upper electrode on the dielectric film 140, a step of providing the protective film 130 on the upper conductive layer 122, a step of providing the second principal surface 112 facing the first principal surface 111 on the substrate 110, a step of providing the first end surface 114 connecting the first principal surface 111 and the second principal surface 112 on the substrate 110, and a step of providing the first terminal electrode 124 electrically connected to any one of the upper electrode and the lower electrode on the first end surface 114.

According to the above-described mode, the facing area between the first terminal electrode and the lower electrode where stray capacitance occurs can be reduced. Furthermore, a distance between the first terminal electrode and the lower electrode can be made longer. From these matters, it is possible to provide a capacitor capable of reducing the stray capacitance that parasitizes the intrinsic capacitance. Moreover, since the area of the first terminal electrode can be increased and the solder can be formed in a fillet shape at the time of mounting, it is possible to improve the fixing force of the solder of the first terminal electrode at the time of mounting the capacitor.

In the step of providing the first terminal electrode 124, the first terminal electrode 124 may be provided over the second principal surface 112 of the substrate 110. According to this, the area of the first terminal electrode can be increased more and the fixing force of the solder of the first terminal electrode can be improved.

In the step of providing the first end surface 114, there may be provided the second end surface 113 that connects the first principal surface 111 and the second principal surface 112 and faces the first end surface 114, and in the step of providing the first terminal electrode 124, there may be provided, on the second end surface 113, the second terminal electrode 123 electrically connected to the other of the upper electrode and the above-described lower electrode. According to this, since the second terminal electrode faces the lower electrode of the same electric potential across the substrate, it is possible to suppress the occurrence of the stray capacitance constituted by the second terminal electrode. Moreover, the fixing force of the solder on the second terminal electrode can be improved. Since the first terminal electrode and the second terminal electrode can be made a symmetrical structure, the mounting attitude of the capacitor is stabilized. Moreover, a point that the solder becomes a fillet shape also contributes to the stability of the mounting attitude.

In the step of providing the second terminal electrode 123, the second terminal electrode 123 may be provided over the second principal surface 112 of the substrate 110. According to this, the area of the second terminal electrode can be increased more and the fixing force of the solder of the second terminal electrode can be improved.

In the manufacturing method for the capacitor according to the above-described embodiment, when viewed in a planar view from the normal direction of the first principal surface 11, the first terminal electrode 24 may be located on the outside of the intrinsic capacitance portion 2 constituted by the upper electrode 22A, the dielectric film 40, and the lower electrode 21A. According to this, the facing area between the lower electrode and the first terminal electrode can be reduced more, and the stray capacitance can be reduced.

In the manufacturing method for the capacitor according to the above-described embodiment, the first principal surface 11 and the second principal surface 12 may be a flat surface. According to this, the handling properties of the substrate in the manufacturing process of a capacitor can be improved. Moreover, it is possible to suppress the disconnection of the terminal electrode caused by an uneven surface.

In the manufacturing method for the capacitor according to the above-described embodiment, the thickness T of the substrate 10 may be larger than the sum of the thicknesses of the lower electrode 21A, the dielectric film 40, the upper electrode 22A, and the protective film 30. According to this, the stray capacitance can be reduced sufficiently. Moreover, the mechanical strength of the substrate can be secured, the poor formation due to damage such as cracks and deformation of the substrate can be reduced in the manufacturing process, and it is possible to improve the yield.

In the manufacturing method for the capacitor according to the above-described embodiment, at least a part of the first end surface 14 may have a tapered shape in which an angle formed with the second principal surface 12 is an obtuse angle. According to this, the area of the circuit board necessary for mounting of the capacitor can be reduced, while securing the area of the intrinsic capacitance portion. Moreover, the area of the first terminal electrode on the first end surface can be increased more, and further, the fixing force of the solder can be improved.

In the manufacturing method for the capacitor according to the above-described embodiment, an angle that at least a part of the first end surface 14 forms with the second principal surface 12 may be 90 degrees to 135 degrees. According to this, the area of the first terminal electrode on the first end surface can be increased more, and the fixing force of the solder can be improved.

In the step of providing the lower conductive layer 121, the lower electrode 21A and the lower portion 21B electrically separated from the lower electrode 21A are pattern-formed, and in the step of providing the first terminal electrode 124, the first terminal electrode 124 may be connected to the lower electrode 21A that overlaps with the end portion of the upper electrode 22A. According to this, in the step of providing the first end surface, it is possible to suppress the protective film from being exposed to the second principal surface side of the substrate due to a matter that the lower conductive layer is excessively excavated at the time of excavating the substrate. Accordingly, it is possible to improve the electric connectivity between the first terminal electrode and the upper conductive layer.

In the step of providing the upper conductive layer 122, the upper electrode 22A and the upper portion 22B that is electrically separated from the upper electrode 22A and overlaps with the end portion of the lower electrode 21A are pattern-formed, and in the step of providing the second terminal electrode 123, the second terminal electrode 123 may be connected to a region where the lower electrode 21A overlaps with the upper portion 22B. According to this, in the step of providing the first end surface, it is possible to suppress the protective film from being exposed to the second principal surface side of the substrate due to a matter that the upper conductive layer is excessively excavated at the time of excavating the substrate. Accordingly, it is possible to improve the electric connectivity between the second terminal electrode and the lower conductive layer.

As described in the above, according to the present invention, it becomes possible to provide a capacitor capable of aiming at reduction of a fluctuation of a capacitance value.

In this connection, the embodiments described in the above are for making the understanding of the present invention easy and are not for interpreting the present invention by limiting. The present invention can be changed and improved without deviating from its intention, and the equivalents are included in the present invention. That is, those in which a person skilled in the art has added the design changes appropriately to each of the embodiments are included in the scope of the present invention as long as being provided with the features of the present invention. For example, each element equipped by each of the embodiments and its arrangement, material, conditions, shape, size, etc. are not necessarily limited to those having been exemplified and can be modified appropriately. Moreover, elements equipped by each of the embodiments can be combined as long as being technically possible, and those in which these have been combined are included in the scope of the present invention as long as including the features of the present invention.

DESCRIPTION OF REFERENCE SYMBOLS

1: capacitor
2: intrinsic capacitance portion
10: substrate
11: first principal surface
12: second principal surface
13: second end surface
14: first end surface
L: length
W: width
T: thickness
θ: angle
21: lower conductive layer
21A: lower electrode
21B: lower portion
22: upper conductive layer
22A: upper electrode
22B: upper portion
23: second terminal electrode
24: first terminal electrode
30: protective film
40: dielectric film

The invention claimed is:

1. A capacitor comprising:
a substrate including a first principal surface, a second principal surface facing the first principal surface, and a first end surface connecting the first principal surface and the second principal surface;
a lower electrode on the first principal surface of the substrate;
a dielectric film on the lower electrode;
an upper electrode on the dielectric film;
a protective film in direct contact with each of the upper electrode, the lower electrode, and the dielectric film, and covering an entirety of the first principal surface of the substrate, the protective film having a thickness smaller than a thickness of the substrate; and
a first terminal electrode on the first end surface and electrically connected to one of the upper electrode and the lower electrode.

2. The capacitor according to claim 1, wherein the first terminal electrode extends from the first end surface of the substrate to the second principal surface.

3. The capacitor according to claim 1, further comprising:
a lower portion that on the first principal surface of the substrate, that is electrically separated from the lower electrode, and overlaps with an end portion of the upper electrode, and
wherein the first terminal electrode is electrically connected to the lower portion.

4. The capacitor according to claim 1, wherein the substrate further includes a second end surface facing the first end surface, the first terminal electrode is electrically connected to the lower electrode, and the capacitor further comprises:
a second terminal electrode on the second end surface and electrically connected to the upper electrode.

5. The capacitor according to claim 4, wherein the second terminal electrode extends from the second end surface to the second principal surface of the substrate.

6. The capacitor according to claim 4, further comprising
an upper portion on the lower electrode, that is electrically separated from the upper electrode, and overlaps with an end portion of the lower electrode,
wherein the second terminal electrode is electrically connected to a region where the lower electrode overlaps with the upper portion.

7. The capacitor according to claim 1, wherein, when viewed in a planar view from a normal direction of the first principal surface, the first terminal electrode is located on an outside of an intrinsic capacitance portion formed by the upper electrode, the dielectric film, and the lower electrode.

8. The capacitor according to claim 1, wherein the first principal surface and the second principal surface each are a flat surface.

9. The capacitor according to claim 1, wherein the thickness of the substrate is larger than a sum of thicknesses of the lower electrode, the dielectric film, the upper electrode, and the protective film.

10. The capacitor according to claim 1, wherein at least a part of the first end surface has a tapered shape in which an angle formed with the second principal surface is an obtuse angle.

11. The capacitor according to claim 1, wherein at least a part of the first end surface has a tapered shape in which an angle formed with the second principal surface is 90 degrees to 135 degrees.

12. A capacitor comprising:
a substrate including a first principal surface, a second principal surface facing the first principal surface, a first end surface connecting the first principal surface and the second principal surface, and a first through hole penetrating from the second principal surface to the first principal surface;
a lower electrode on the first principal surface of the substrate;
a dielectric film on the lower electrode;
an upper electrode on the dielectric film;
a protective film in direct contact with each of the upper electrode, the lower electrode, and the dielectric film, and covering an entirety of the first principal surface of the substrate, the protective film having a thickness smaller than a thickness of the substrate;
a first via electrode inside of the first through hole and electrically connected to one of the upper electrode and the lower electrode; and a first terminal electrode on the second principal surface and electrically connected to the first via electrode.

13. The capacitor according to claim 12, wherein the first terminal electrode extends from the second principal surface to the first end surface of the substrate.

14. The capacitor according to claim 12, wherein the substrate further includes a second end surface facing the first end surface, and a second through hole penetrating from the second principal surface to the first principal surface, and the first via electrode is electrically connected to the lower electrode, the capacitor further comprising:

a second via electrode inside of the second through hole and electrically connected to the upper electrode; and a second terminal electrode on the second principal surface and electrically connected to the second via electrode.

15. The capacitor according to claim 14, wherein the second terminal electrode extends from the second principal surface to the second end surface of the substrate.

16. The capacitor according to claim 12, wherein when viewed in a planar view from a normal direction of the first principal surface, the first terminal electrode is located on an outside of an intrinsic capacitance portion formed by the upper electrode, the dielectric film, and the lower electrode.

17. The capacitor according to claim 12, wherein the first principal surface and the second principal surface each are a flat surface.

18. The capacitor according to claim 12, wherein the thickness of the substrate is larger than a sum of thicknesses of the lower electrode, the dielectric film, the upper electrode, and the protective film.

19. The capacitor according to claim 12, wherein at least a part of the first end surface has a tapered shape in which an angle formed with the second principal surface is an obtuse angle.

20. The capacitor according to claim 12, wherein at least a part of the first end surface has a tapered shape in which an angle formed with the second principal surface is 90 degrees to 135 degrees.

* * * * *